United States Patent
Yoshizawa et al.

(10) Patent No.: US 7,907,004 B2
(45) Date of Patent: Mar. 15, 2011

(54) SIGNAL PROCESSING APPARATUS, FILTER APPARATUS, SIGNAL PROCESSING METHOD AND FILTERING METHOD

(75) Inventors: Atsushi Yoshizawa, Kanagawa (JP); Sachio Iida, Chiba (JP)

(73) Assignee: Sony Corporation, Tokyo (JP)

(*) Notice: Subject to any disclaimer, the term of this patent is extended or adjusted under 35 U.S.C. 154(b) by 232 days.

(21) Appl. No.: 12/174,422

(22) Filed: Jul. 16, 2008

(65) Prior Publication Data

US 2009/0021297 A1 Jan. 22, 2009

(30) Foreign Application Priority Data

Jul. 18, 2007 (JP) .............................. P2007-187660

(51) Int. Cl.
*H04B 1/10* (2006.01)
(52) U.S. Cl. .............................. 327/554; 327/91; 327/94
(58) Field of Classification Search .................. 327/554, 327/91, 94
See application file for complete search history.

(56) References Cited

U.S. PATENT DOCUMENTS

| | | | | |
|---|---|---|---|---|
| 5,162,670 A | * | 11/1992 | Itakura et al. .................... | 327/93 |
| 5,945,872 A | * | 8/1999 | Robertson et al. ............. | 327/541 |
| 5,963,063 A | * | 10/1999 | Sugihashi ........................ | 327/94 |
| 6,344,767 B1 | * | 2/2002 | Cheung et al. ................. | 327/336 |
| 2006/0022745 A1 | * | 2/2006 | Nakamura ..................... | 327/541 |
| 2009/0135039 A1 | * | 5/2009 | Iida et al. ....................... | 341/143 |

OTHER PUBLICATIONS

R. Bagheri et al., "An 800MHz to 5GHz Software-Defined Radio Receiver in 90nm CMOS", ISSCC 2006/Session 26/Cellular Building Blocks and SOCS/26.6.

* cited by examiner

*Primary Examiner* — Lincoln Donovan
*Assistant Examiner* — Ryan C Jager
(74) *Attorney, Agent, or Firm* — Finnegan, Henderson, Farabow, Garrett & Dunner, L.L.P.

(57) ABSTRACT

There is provided a signal processing apparatus including a variable capacitor and a switching portion for switching the circuit mode between a sampling mode, in which the variable capacitor samples an input signal, a holding mode, in which a charge gained by sampling the input signal is held in the variable capacitor, and an output mode for outputting the charge stored in the variable capacitor, wherein the variable capacitor is provided with an input terminal through which the input signal is inputted in the sampling mode, a control terminal to which a first control signal which decreases the capacitance of the variable capacitor to a value below the capacitance in the sampling mode is inputted in the output mode, and a second control signal having a predetermined reference voltage is inputted in the holding mode, where an insulating layer is provided between the control terminal and the input terminal.

6 Claims, 10 Drawing Sheets

SIGNAL PROCESSING APPARATUS, FILTER APPARATUS, SIGNAL PROCESSING METHOD AND FILTERING METHOD

CROSS REFERENCES TO RELATED APPLICATIONS

The present invention contains subject matter related to Japanese Patent Application JP 2007-187660 filed in the Japan Patent Office on Jul. 18, 2007, the entire contents of which being incorporated herein by reference.

BACKGROUND OF THE INVENTION

1. Field of the Invention

The present invention relates to a signal processing apparatus, a filter apparatus, a signal processing method and a filtering method.

2. Description of the Related Art

In recent years, the speed of operation of transistors has increased as CMOS processes have made miniaturization possible, while the power supply voltage that can be supplied to operate transistors has decreased. Though such decrease in the power supply voltage in some cases places limits in terms of the design of the circuit, it is difficult to place limits on charge domain filter circuits in terms of the design of the circuit caused by decrease in the power supply voltage, and therefore, it is expected that the importance in charge domain filter circuits will further increase in the future.

When a filter circuit, a gain variable amplifier or the like is formed in a wireless communication apparatus using an analog circuit of a continuous time system CMOS circuit in related art, for example, generally an issue arises, such that the dynamic range properties are not good or the properties become inconsistent. In contrast, the charge domain filter circuit described in 2006 IEEE International Solid-State Circuits Conference 26.6 "An 800 MHz to 5 GHz Software-Defined Radio Receiver in 90 nm CMOS" can be easily applied to a filter circuit, a gain variable amplifier or the like provided in a wireless communication apparatus, and a filter circuit or a gain variable amplifier having excellent properties can be implemented.

Concretely, the charge domain filter circuit described in 2006 IEEE International Solid-State Circuits Conference 26.6 "An 800 MHz to 5 GHz Software-Defined Radio Receiver in 90 nm CMOS" is provided with a number of capacitors and a number of switches for electrically connecting each capacitor to an input terminal on the basis of a control signal so that different capacitors sample input signals in sequence. Here, CMOS capacitors, for example, can be used as the capacitors.

SUMMARY OF THE INVENTION

However, when the gate oxide film of transistors becomes extremely thin as the CMOS process makes miniaturization possible, in some cases, the tunnel current in the gate oxide film increases. Accordingly, a current leaks through the gate of transistors during operation in chare domain filter circuits in related art using this process, and the signal component is attenuated, causing the filter performance to deteriorate.

In addition, in charge domain filter circuits having a number of filter circuit stages including the number of capacitors, in the case where the input signals sampled by the number of capacitors included in the front filter circuit stage are decimated and conveyed to the rear filter circuit stage, the time difference between the sampling time and the output time of the capacitors increase as the input signals progress to the rear filter circuit stage. As a result, the total leak of the input signals sampled by the capacitors increases, and there are cases where the input signals significantly deteriorate.

Thus, the present invention is provided in view of the above described issues, and it is desirable to provide a novel and improved signal processing apparatus which makes it possible to reduce a leak current in the capacitors, a filter apparatus, a signal processing method and a filtering method.

According to an embodiment of the present invention, there is provided a signal processing apparatus with a variable capacitor of which the capacitance is variable; and a switching portion for switching the circuit mode between a sampling mode for making the input signal sampled by the variable capacitor, a holding mode for holding a charge gained by sampling the input signal in the variable capacitor, and an output mode for outputting a charge stored in the variable capacitor, wherein the variable capacitor includes: an input terminal through which the input signal is inputted at the time of the sampling mode; and a control terminal to which a first control signal which decreases the capacitance of the variable capacitor to a value below the capacitance in the sampling mode is inputted in the output mode, and a second control signal having a predetermined reference voltage is inputted in the holding mode, where an insulating layer is provided between the control terminal and the input terminal.

In this configuration, the variable capacitor samples an input signal in the input terminal in the sampling mode and holds the charge gained through sampling in the holding mode. In addition, in the holding mode, a second control signal having a predetermined reference voltage is inputted through the control terminal of the variable capacitor provided with an insulating layer on the side facing the input terminal. Accordingly, in the holding mode, there is a difference in potential between the voltage corresponding to the amount of charge gained through sampling and the voltage of the control terminal between the input terminal and the control terminal of the variable capacitor in the holding mode. In addition, there may be a leak current between the input terminal and the control terminal of the variable capacitor, depending on the degree of the difference in potential. Therefore, the second control signal having a predetermined reference voltage is inputted into the control terminal of the variable capacitor in the holding mode, and thus, the leak current between the input terminal and the control terminal of the variable capacitor can be adjusted to an amount in accordance with a predetermined reference voltage.

The switching portion may switch the circuit mode between the sampling mode, the holding mode and the output mode, in addition to a reset mode, in which a common mode voltage is applied to the input terminal of the variable capacitor, and the reference voltage may be the same as the common mode voltage or a voltage which is close to the common mode voltage. In this configuration, the voltage value at the input terminal of the variable capacitor fluctuates with the common mode voltage, for example, at approximately the center. Therefore, a common mode voltage is applied to the control terminal of the variable capacitor in the holding mode, and thus, a leak current can be suppressed between the input terminal and the control terminal of the variable capacitor.

The variable capacitor may be a CMOS capacitor. In addition, the variable capacitor may include at least two N type MOS capacitors or at least two P type MOS capacitors, a first terminal of one N type MOS capacitor or one P type MOS capacitor may be used as the input terminal and a second terminal used as the control terminal, and a second terminal of another N type MOS capacitor or another P type MOS capacitor may be used as the input terminal and a first terminal used as the control terminal. In this configuration, the variable capacitor can amplify the signal component in the voltage corresponding to the charge gained through sampling in the sampling mode and output the resulting signal component in the output mode.

According to another embodiment of the present invention, there is provided a filter apparatus, wherein different variable capacitors sample input signals in sequence and at least a portion of a charge held in a number of variable capacitors after sampling is outputted to a rear stage capacitor which can be electrically connected to the number of variable capacitors. This filter apparatus is provided with: a switching portion for switching the circuit mode between a sampling mode, in which the input signals are sampled by the variable capacitors, a holding mode in which a charge gained by sampling the input signals is held in the variable capacitor, and an output mode, in which a charge held by the variable capacitor is outputted, and the variable capacitors include: an input terminal through which the input signals are inputted in the sampling mode; and a control terminal to which a first control signal which decreases the capacitance of the variable capacitor to a value below the capacitance in the sampling mode is inputted in the output mode, and a second control signal having a predetermined reference voltage is inputted in the holding mode, where an insulating layer is provided between the control terminal and the input terminal.

In this configuration, the variable capacitor samples input signals in the input terminal in the sampling mode and holds a charge gained through sampling in the holding mode. In addition, a second control signal having a predetermined reference voltage is inputted into the control terminal of the variable capacitor, which is provided on the surface facing the input terminal via an insulating layer in the holding mode. Accordingly, there is a difference in potential between the voltage corresponding to the amount of charge gained through sampling and the voltage in the control terminal, for example between the input terminal and the control terminal of the variable capacitor in the holding mode. In addition, there may be a leak current between the input terminal and the control terminal of the variable capacitor, depending on the degree of the difference in potential. Therefore, a second control signal having a predetermined reference voltage is inputted into the control terminal of the variable capacitor in the holding mode, and thus, the leak current between the input terminal and the control terminal of the variable capacitor can be adjusted to an amount in accordance with the predetermined reference voltage. As a result, in the case where the predetermined reference voltage has an appropriate value, the signal component of the input signal in the filter apparatus can be prevented from being attenuated or deteriorating.

According to another embodiment of the present invention, there is provided a signal processing method including the steps of: inputting an input signal through an input terminal of a variable capacitor of which the capacitance is variable and making the variable capacitor sample the input signal; holding a charge gained by sampling the input signal in the variable capacitor; and outputting the charge held in the variable capacitor, wherein in the outputting step, a first control signal for lowering the capacitance of the variable capacitor to a value beneath the capacitance in the sampling step is inputted through a control terminal of the variable capacitor which is arranged on the surface facing the input terminal via an insulating layer, and in the holding step, a second control signal having a predetermined reference voltage is inputted through a control terminal of the variable capacitor.

According to another embodiment of the present invention, there is provided a filtering method including the steps of: inputting input signals through input terminals of different variable capacitors in sequence and sampling the input signals in the variable capacitors; holding a charge gained by sampling the input signals in the respective variable capacitors; and outputting the charge held in two or more of the variable capacitors to a rear stage capacitor which is provided in a rear stage, wherein in the output step, a first control signal for lowering the capacitance of the variable capacitors to a value beneath the capacitance in the sampling step is inputted through a control terminal of the variable capacitors which are arranged on the side facing the input terminal via an insulating layer, and in the holding step, a second control signal having a predetermined reference voltage is inputted through a control terminal of the variable capacitor.

According to the embodiment of the present invention described above, it is possible to reduce the leak current in the capacitors.

DETAILED DESCRIPTION OF THE PREFERRED EMBODIMENTS

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

In addition, the components of the "best mode for carrying out the invention" are described in the following order.

[1] Outline of Filter Apparatus According to Present Embodiment

[2] Objects of Filter Apparatus According to Present Embodiment

[3] Amplifying Portion that Forms Filter Apparatus

[3-1] First Example of Configuration of Amplifying Portion

[3-2] Second Example of Configuration of Amplifying Portion

[3-3] Third Example of Configuration of Amplifying Portion

[4] Filtering Method Used in Filter Apparatus

[5] Conclusions

[1] Outline of Filter Apparatus According to Present Embodiment

First, the outline of the filter apparatus 100 according to the present embodiment is described with reference to FIGS. 1 to 4.

Figure 1:
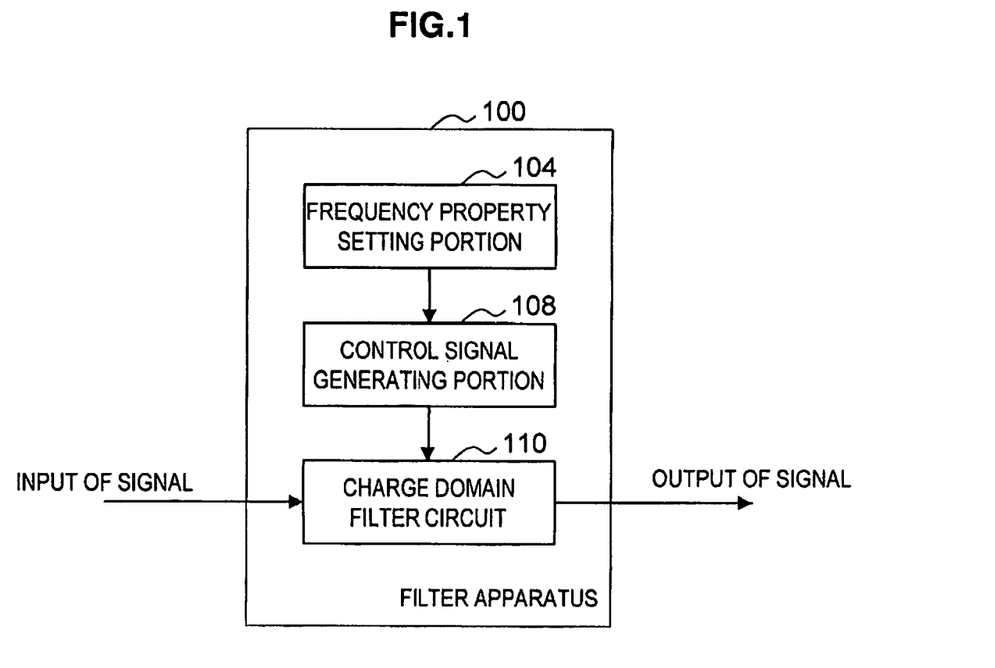
FIG. 1 is a diagram illustrating the configuration of the filter apparatus according to the present embodiment.
Figure 2:
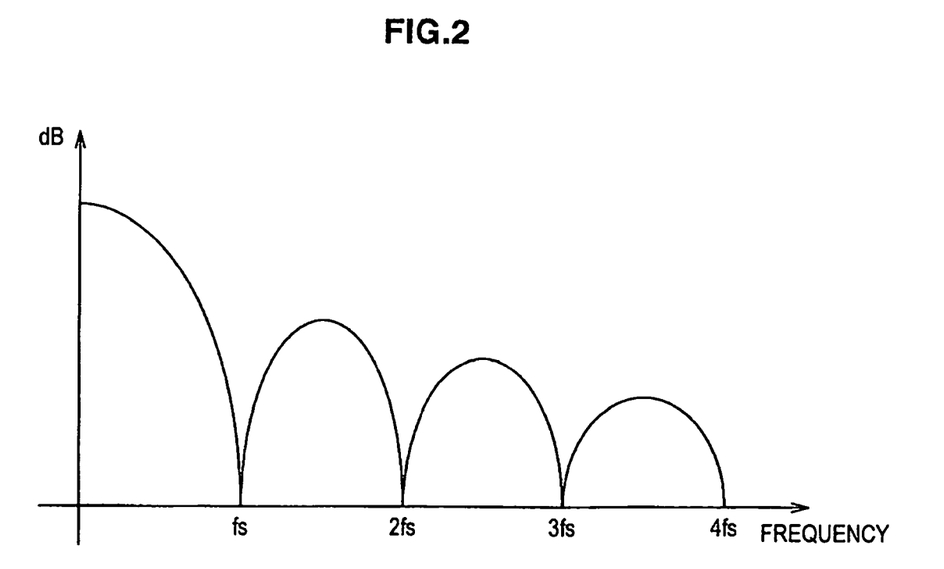
FIG. 2 is a graph illustrating the frequency properties of the output signal gained through the operation of the filter apparatus according to the present embodiment.
Figure 3:
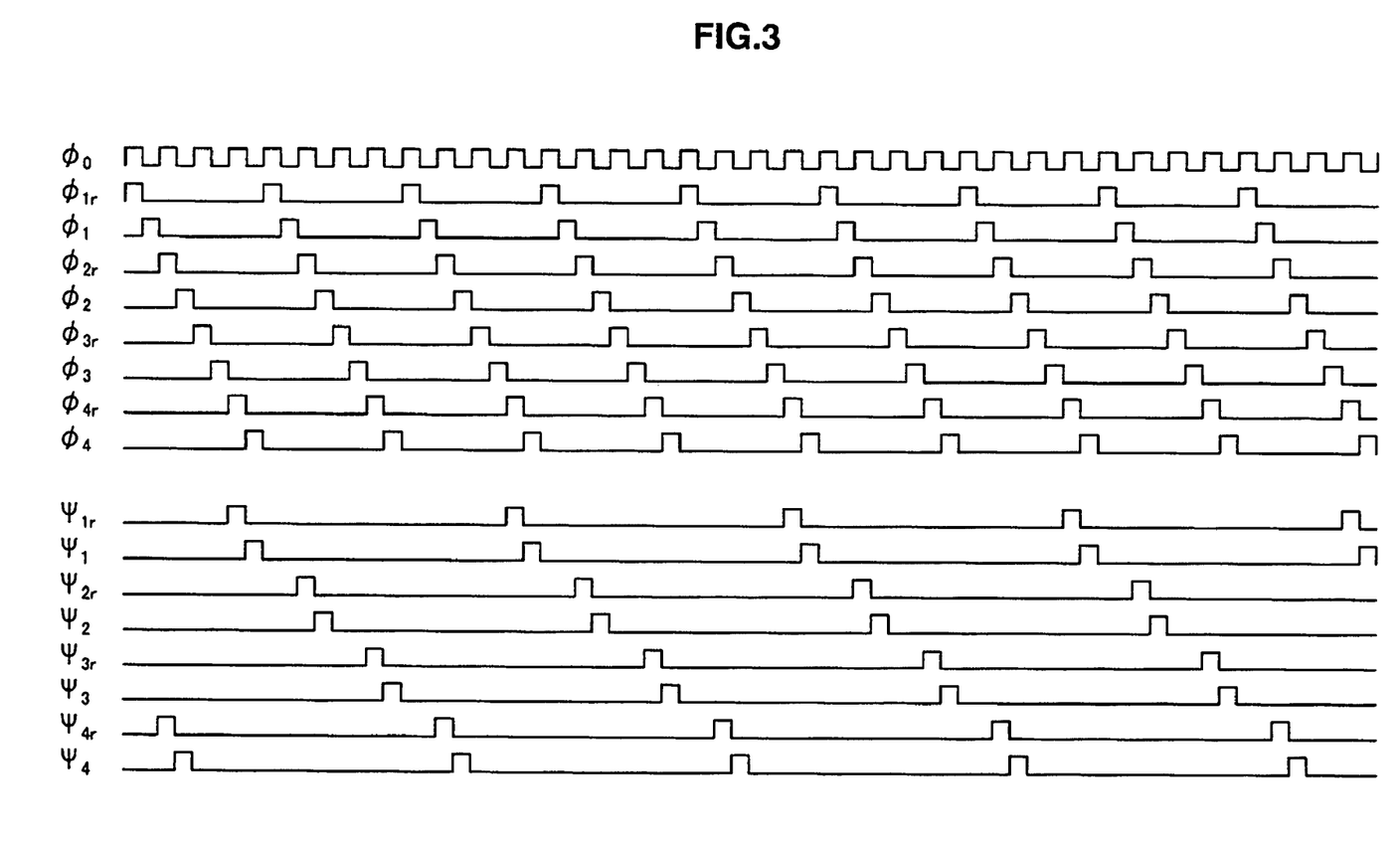
FIG. 3 is a graph illustrating control signals generated by the control signal generating portion.

FIG. 1 is a diagram illustrating the configuration of the filter apparatus 100 according to the present embodiment. FIG. 2 is a graph illustrating the frequency properties of an output signal gained through the operation of the filter apparatus 100. FIG. 3 is a graph illustrating control signals generated by the control signal generating portion 108.

As shown in FIG. 1, the filter apparatus 100 is provided with a frequency property setting portion 104, a control signal generating portion 108 and a charge domain filter circuit 110. The frequency property setting portion 104 sets the frequency properties of an output signal gained via the charge domain filter circuit 110 (see FIG. 2). The frequency property setting portion 104 may be provided with a user interface which is operated by the user so that they can gain desired frequency properties.

The control signal generating portion 108 generates control signals (pulse signals) for determining the frequency properties of the charge domain filter circuit 110 which are set by the frequency property setting portion 104, and outputs them to the charge domain filter circuit 110. Control signals included in the same signal set ($\phi 1r$ to $\phi 4$, control signal $\Psi 1r$ to control signal $\Psi 4$) have a predetermined phase difference and the same frequency, and periods when the signal level is H do not overlap, as shown in, for example, FIG. 3. In addition, the control signals function as mode switching signals for switching the circuit mode (circuit configuration) of the charge domain filter circuit 110.

The charge domain filter circuit 110 operates on the basis of the control signals shown in FIG. 3, which are generated by the control signal generating portion 108, and filters input signals. Signals outputted via the first filter circuit stage 120 described below that forms the charge domain filter circuit 110 have the frequency properties shown in FIG. 2, for example.

As shown in FIG. 2, the frequency properties of signals which are outputted via the first filter circuit stage 120 described below are such that the frequency fs specified in accordance with the period of control signals generated by the control signal generating portion 108 and a frequency which is an integer times greater than the frequency fs are gained at points where signal level is zero, or null. Such frequency properties are similar to the SINC function in form, and therefore, circuits which can provide these frequency properties can be referred to as a SINC filter circuit. In addition, these frequency properties can be changed simply by changing the control signals generated by the control signal generating portion 108, and therefore, are advantageous, in that it is not necessary to provide a number of filter circuits in order to gain different frequency properties.

Next, the circuit configuration of the charge domain filter circuit 110 is described in detail with reference to FIG. 4.

Figure 4:
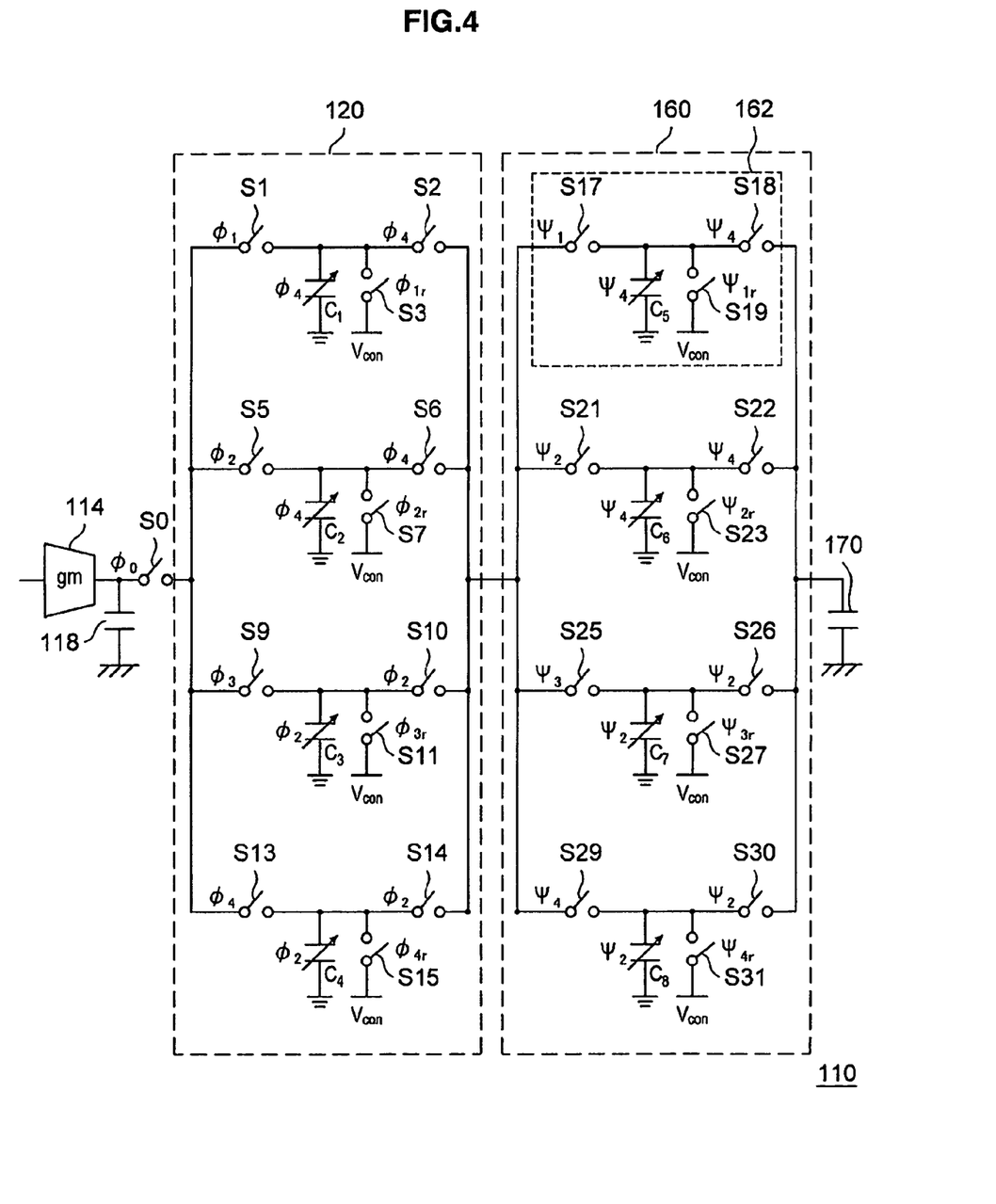
FIG. 4 is a diagram illustrating a circuit configuration of the charge domain filter circuit according to the present embodiment.

FIG. 4 is a diagram illustrating the circuit configuration of the charge domain filter circuit 110 according to the present embodiment. The charge domain filter circuit 110 is provided with a transconductor (gm) 114, an IIR capacitor 118, a first filter circuit stage 120, a second filter circuit stage 160 and an internal or external output capacitor 170. In addition, the control signals shown in FIG. 3 are inputted into the charge domain filter circuit 110. In addition, in the following, a case where the sampling speed of the first filter circuit stage 120 is decimated to ½ in the second filter circuit stage 160 is described as an example.

The transconductor 114 functions as a signal current outputting portion for converting the voltage of an inputted signal to a current which is proportional to the voltage, and outputs a current. The IIR capacitor 118 is connected to the transconductor 12 and functions in such a manner as to provide IIR properties to the charge domain filter circuit 110. Here, it is not essential to the present embodiment that IIR properties be provided to the charge domain filter circuit 110, and therefore, it is not necessary to provide the charge domain filter circuit 110 with an IIR capacitor 118.

The first filter circuit stage 120 includes capacitors C1, C2, C3 and C4, and switches S1, S2, S3, S5, S6, S7, S9, S10, S11, S13, S14 and S15, which are switching portions.

The capacitors C1, C2, C3 and C4 have a function of storing a charge. In addition, the capacitors C1, C2, C3 and C4 according to the present embodiment may be varicaps (varactors) using a MOS of which the capacitance is variable or variable capacitance diodes. The MOS may operate in an inversion mode or in an accumulation mode.

In addition, each capacitor C is provided with a control terminal into which a control signal for lowering the capacitance value is inputted. In the present embodiment, a common mode voltage, which is an example of a predetermined reference voltage, can be applied to the control terminal as a second control signal. In the case where the capacitor C is a MOS capacitor, the control terminal corresponds to, for example, the source and the drain.

The switch S1 is a switch for electrically connecting or disconnecting the capacitor C1 and the transconductor 114. $\phi 1$ shown beside the switch S1 indicates that the switch S1 is closed while the control signal $\phi 1$, which is inputted into the charge domain filter circuit 110, is at the H level, so that the capacitor C1 and the transconductor 114 are electrically connected. That is to say, $\phi 1$ functions as a mode switching signal for switching the circuit mode of at least a portion of the charge domain filter circuit 110. Control signals $\phi 2$ to $\phi 4$, control signals $\phi 1r$ to $\phi 4r$, control signals $\Psi 1$ to $\Psi 4$ and control signals $\Psi 1r$ to $\Psi 4r$ function as mode switching signals in the same manner.

The switch S2 is a switch for electrically connecting and disconnecting the capacitor C1, the capacitor C2 and the capacitor C5 or C7 in the second filter circuit stage 160. $\phi 4$ shown beside the switch S2 indicates that the switch S2 is closed while the control signal $\phi 4$ which is inputted into the charge domain filter circuit 110 is at the H level. As a result, the capacitor C1, the capacitor C2 and the capacitor C5 or C7 in the second filter circuit stage 160 are electrically connected.

The switch S3 is a switch for electrically connecting or disconnecting the capacitor C1 and Vcom. $\phi 1r$ shown beside the switch S3 indicates that the switch S3 is closed while the control signal φ1r, which is inputted into the charge domain circuit 110, is at the H level, so that the capacitor C1 and Vcom are electrically connected.

The switch S5 is a switch for electrically connecting or disconnecting the capacitor C2 and the transconductor 114 on the basis of the control signal φ2, as is the switch S1. In addition, the switch S9 is a switch for electrically connecting or disconnecting the capacitor C3 and the transconductor 114 on the basis of the control signal φ3. In addition, the switch S13 is a switch for electrically connecting or disconnecting the capacitor C4 and the transconductor 114 on the basis of the control signal φ4.

The switch S6 is a switch for electrically connecting or disconnecting the capacitor C1, the capacitor C2 and the capacitor C5 or C7 of the second filter circuit stage 160 on the basis of the control signal φ4, as is the switch S2. In addition, the switch S10 is a switch for electrically connecting or disconnecting the capacitor C3, the capacitor C4 and the capacitor C6 or C8 of the second filter circuit stage 160 on the basis of the control signal φ2. In addition, the switch S10 is a switch for electrically connecting or disconnecting the capacitor C3, the capacitor C4 and the capacitor C6 or C8 of the second filter circuit stage 160 on the basis of the control signal φ4.

The switch S7 is a switch for connecting or disconnecting the capacitor C2 and Vcom on the basis of the control signal φ2r, as is the switch S3. In addition, the switch S11 is a switch for connecting or disconnecting the capacitor C3 and Vcom on the basis of the control signal φ3r. In addition, the switch S15 is a switch for connecting or disconnecting the capacitor C4 and Vcom on the basis of the control signal φ4r.

The second filter circuit stage 160 includes capacitors C5, C6, C7 and C8, and switches S17, S18, S19, S21, S22, S23, S25, S26, S27, S29, S30 and S31.

The capacitors C5, C6, C7 and C8 have a function of storing a charge. In addition, the capacitors C5, C6, C7 and C8 according to the present embodiment may be a varicap (varactor) using a MOS which makes the capacitances C1, C2, C3 and C4 variable, or a variable capacitance diode. In addition, the capacitance value of the capacitors C5 and C6 is lowered during the period when the control signal Ψ4 that is inputted in the charge domain filter circuit 110 is at the H level. In addition, the capacitance value of the capacitors C7 and C8 is lowered during the period when the control signal Ψ2 that is inputted in the charge domain filter circuit 110 is at the H level.

The switch S17 is a switch for electrically connecting and disconnecting the capacitors C1 and C2 in the first filter circuit stage 120 and the capacitor C5. Ψ1 shown beside the switch S17 indicates that the switch S17 is closed while the control signal Ψ1 that is inputted into the charge domain filter circuit 110 is at the H level, so that the capacitors C1 and C2 and the capacitor C5 are electrically connected. Here, the circuit mode in which the switch S17 electrically connects the capacitors C1 and C2 in the first filter circuit stage 120 and the capacitor C5 corresponds to the sampling mode.

The switch S18 is a switch for electrically connecting and disconnecting the capacitor C5 and the capacitor C6 and the output capacitor 170. Ψ4 shown beside the switch S18 indicates that the switch S18 is closed while the control signal Ψ4 that is inputted into the charge domain filter circuit 110 is at the H level, so that the capacitors C5 and C6 and the output capacitor 170 are electrically connected. Here, the circuit mode in which the switch S18 electrically connects the capacitor C5 and the capacitor C6 and the output capacitor 170 corresponds to the output mode.

The switch S19 is a switch for electrically connecting and disconnecting the capacitor C5 and Vcom. Ψ1r shown beside the switch S19 indicates that the switch S19 is closed while the control signal Ψ1r that is inputted into the charge domain filter circuit 110 is at the H level, so that the capacitor C5 and Vcom are electrically connected. When the capacitor C5 and Vcom are electrically connected, the voltage of the capacitor C5 is reset to Vcom. Here, the circuit mode in which the switch S19 electrically connects the capacitor C5 and Vcom corresponds to the reset mode.

In addition, the capacitor C5 holds the voltage value in the circuit mode directly before while all of S17 to S19 are open. Thus, the circuit mode when all of the switches S17 to S19 are open corresponds to the holding mode.

In addition, the switches S17 to S19 and the capacitor C5 function as an amplifying portion 162 (signal processing apparatus), and the details thereof are described below. The other capacitors C and the switch group for switching the circuit mode for these capacitors C also function as an amplifying portion, in the same manner.

The switch S21 is a switch for electrically connecting or disconnecting the capacitors C3 and C4 of the first filter circuit stage 120 and the capacitor C6 on the basis of the control signal Ψ2, as is the switch S17. In addition, the switch S25 is a switch for electrically connecting or disconnecting the capacitors C1 and C2 of the first filter circuit stage 120 and the capacitor C7 on the basis of the control signal Ψ3. In addition, the switch S29 is a switch for electrically connecting or disconnecting the capacitors C3 and C4 of the first filter circuit stage 120 and the capacitor C8 on the basis of the control signal Ψ4.

The switch S22 is a switch for electrically connecting or disconnecting the capacitor C5, the capacitor C6 and the output capacitor 170 on the basis of the control signal Ψ4, as is the switch S18. In addition, the switch S26 is a switch for electrically connecting or disconnecting the capacitor C7, the capacitor C8 and the output capacitor 170 on the basis of the control signal Ψ2. In addition, the switch S30 is a switch for electrically connecting or disconnecting the capacitor C7, the capacitor C8 and the output capacitor 170 on the basis of the control signal Ψ2.

The switch S23 is a switch for electrically connecting or disconnecting the capacitor C6 and Vcom on the basis of the control signal Ψ2r, as is the switch S19. In addition, the switch S27 is a switch for electrically connecting or disconnecting the capacitor C7 and Vcom on the basis of the control signal Ψ3r. In addition, the switch S31 is a switch for electrically connecting or disconnecting the capacitor C8 and Vcom on the basis of the control signal Ψ4r.

The output capacitor 170 has a capacitance for taking out the output from the charge domain filter circuit 110, for example. In addition, the output capacitor 170 may be an A/D converter. Here, in the case where a certain capacitor C is regarded as the first capacitor, the capacitor C included in the filter circuit stage in the rear stage of the filter circuit stage in which the capacitor C is included can be regarded as the second capacitor.

In addition, a control signal for lowering the capacitance (first control signal) is inputted into the control terminal (not shown) of the capacitor C5 while the switch S18 is turned on and electrical connection to the output capacitor 170 is made. Here, it can be seen from the formula Q=CV (Q is the charge, C is the capacitance and V is the voltage) that the amount of charge of the capacitor C5 can be reduced by lowering the capacitance. Accordingly, when the charge is shared between the capacitors C5 and C6 and the output capacitor 170, a control signal for lowering the capacitance is inputted into the control terminal of the capacitor C5 and the amount of charge which remains in the capacitor C5 after charge sharing can be kept low.

In the case where a control signal for increasing the capacitance of the capacitor C5 4 to 5 times is inputted into the control terminal of the capacitor C5 while the switches S18 and S22 are turned on, for example, the amount of charge which remains in the capacitor C5 can be reduced to ⅕ to ¼. As a result, it becomes possible to increase the voltage gain in the charge domain filter circuit 110, and keep the attenuation of the signal component low. Here, the other capacitors C1 to C4 and C6 to C8 can have the same function as the capacitor C5.

[2] Objects of Filter Apparatus According to Present Embodiment

As described above with reference to FIGS. 1 to 4, in the charge domain filter circuit 110, the respective capacitors C sample an input signal so that the signal component of the input signal is outputted through the charge sharing with the capacitor C in the rear stage. In addition, it is necessary for the respective capacitors C to hold the charge or voltage during the period of time between sampling and outputting the input signal.

Here, in order to describe the objects of the filter apparatus 100 according to the present embodiment, the configuration and the objects of the amplifying portion 162' which relates to the present embodiment are described with reference to FIG. 5 as an object to be compared.

Figure 5:
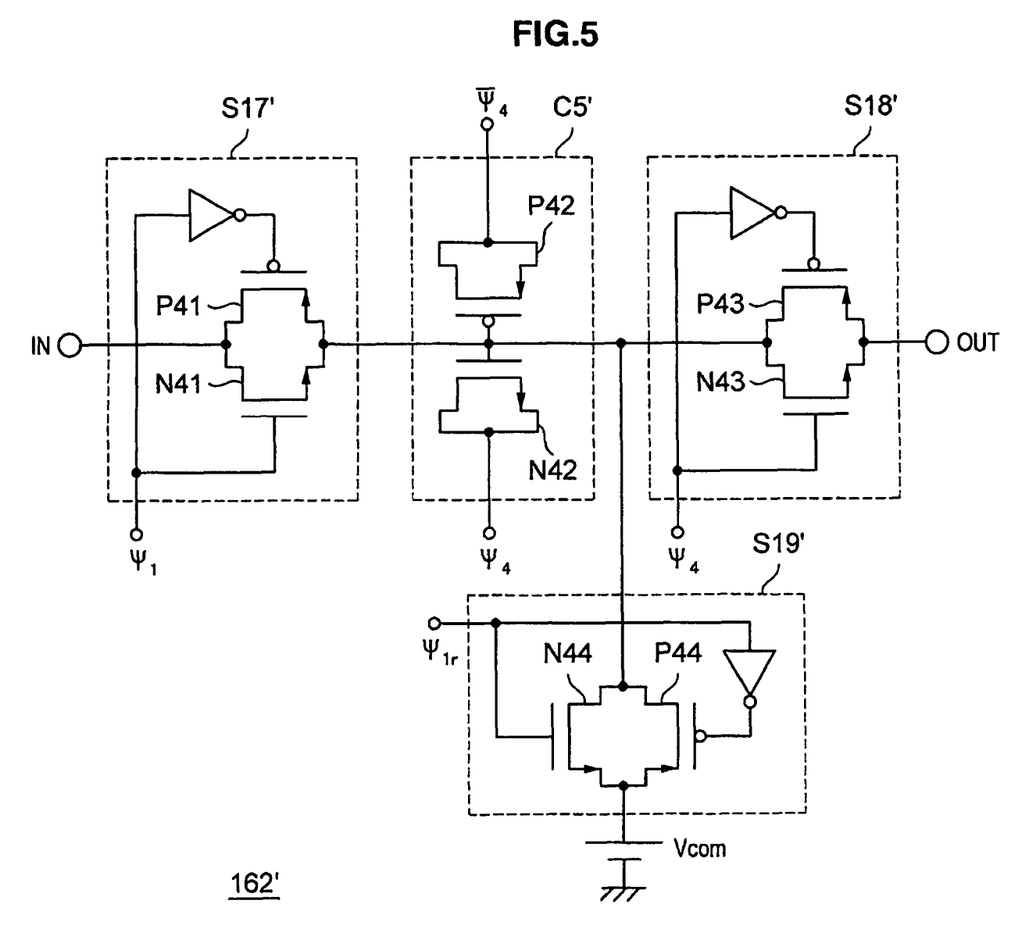
FIG. 5 is a diagram illustrating the configuration of an amplifying portion which relates to the present embodiment.

FIG. 5 is a diagram illustrating the configuration of the amplifying portion 162' which relates to the present embodiment. The amplifying portion 162' includes a switch S17', which includes transistors P41 and N41, C5', which includes transistors P42 and N42, a switch S18', which includes transistors P43 and N43, and a switch S19', which includes transistors P44 and N44. Here, the alphabets included in the symbols indicating the transistors indicate the polarity of the transistors. Concretely, P indicates a P type MOS transistor and N indicates an N type MOS transistor. In addition, the switch S17' corresponds to the switch S17 in FIG. 4, the switch S18' corresponds to the switch S18 in FIG. 4, the switch S19' corresponds to the switch S19 in FIG. 4, and C5' corresponds to C5 in FIG. 4.

The inverted signal of the control signal Ψ1 is inputted into the gate of the transistor P41, and the control signal Ψ1 is inputted into the gate of the transistor N41. Accordingly, the switch S17' is turned on while the control signal Ψ1 is at the H level.

In addition, the inverted signal of the control signal Ψ4 is inputted into the gate of the transistor P43, and the control signal Ψ4 is inputted into the gate of the transistor N43. Accordingly, the switch S18' is turned on while the control signal Ψ4 is at the H level. In the same manner, the inverted signal of the control signal Ψ1r is inputted into the gate of the transistor P44, and the control signal Ψ1r is inputted into the gate of the transistor N44. Accordingly, the switch S19' is turned on while the control signal Ψ1r is at the H level.

The inverted signal of the control signal Ψ4 is inputted into the source and drain of the transistor P42, and the control signal Ψ4 is inputted into the source and drain of the transistor N42. Accordingly, the capacitor C5' shares the charge with the capacitor C in the rear stage while the control signal Ψ4 is at the H level, and at the same time, the capacitance is reduced due to the loss of the inversion layer beneath the gate oxide film.

Here, in general digital circuits, the power supply voltage (VDD) and the ground voltage (GND) are allocated to the logic values at the H level and the L level of the control signals in many cases. This is because the logic circuits implemented with a typical CMOS circuit have such advantages that the tolerance to noise is high and the efficiency is high when the logic circuits turn on/off a switch made of a transistor on the basis of the VDD or GND so that the VDD or GND is outputted.

When this control signal having two values, the VDD or GND, is applied to the capacitor C5', however, in some cases, a tunnel current (leak current) which passes through the gate oxide film of the transistors P42 and N42 is generated. In the following, this is described in detail with reference to FIGS. 6 and 7.

Figure 6:
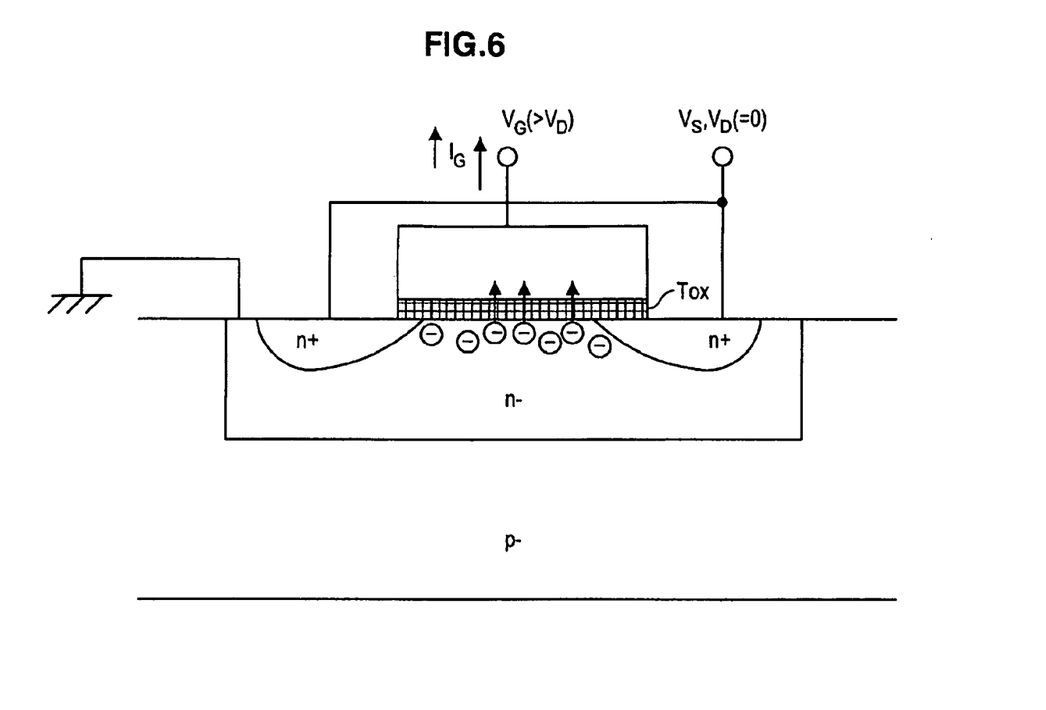
FIG. 6 is a diagram illustrating the manner in which a leak current is caused in the inversion mode of an N type MOS transistor.

FIG. 6 is a diagram illustrating the manner in which a leak current is caused in the inversion mode of an N type MOS transistor. In the inversion mode, a state is gained where a voltage (Vg) which is higher than the source and drain voltage (Vs, Vd) is applied to the gate of the N type MOS transistor. In this inversion mode, an N type channel is formed directly beneath the gate oxide film (Tox).

At this time, electrons in high concentration that form the channel, in some cases, reach the gate side after passing through the gate oxide film. The passing of these electrons through the gate oxide film (insulating layer) is equivalent to a phenomenon where a current flows from the gate toward the N type channel. Accordingly, when the GND is inputted into the source and drain (control terminal) of the transistor N42 which forms the capacitor C5' in the holding mode, the charge stored in the gate (input terminal) flows out to the source and drain side.

Figure 7:
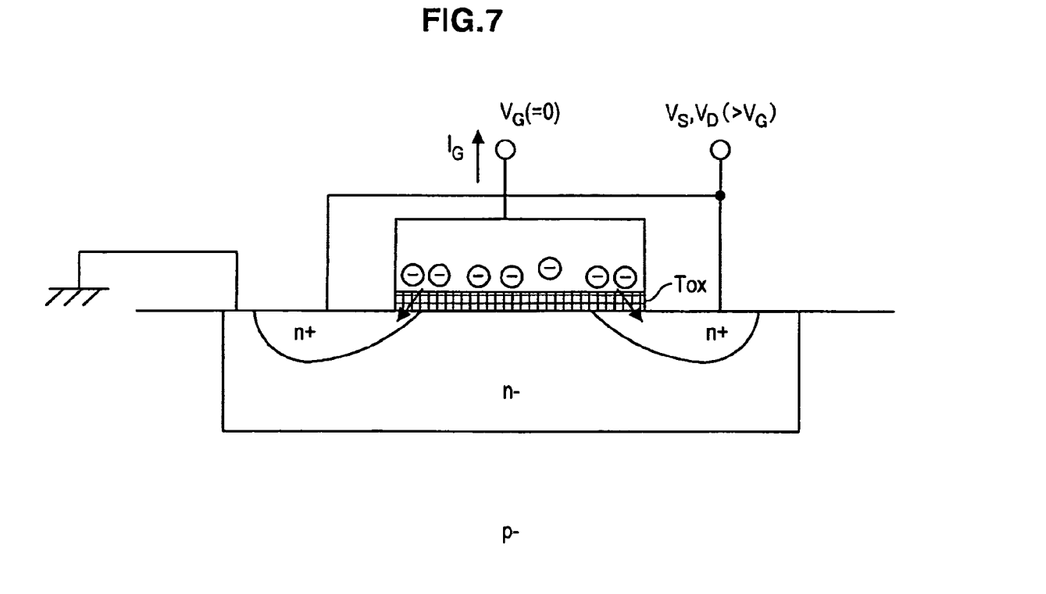
FIG. 7 is a diagram illustrating the manner in which a leak current is caused in the storage mode of an N type MOS transistor.

FIG. 7 is a diagram illustrating the manner in which a leak current is generated in the storage mode of an N type MOS transistor. In the storage mode, a state is gained where a voltage (Vg) which is lower than the source and drain voltage (Vs, Vd) is applied to the gate of the N type MOS transistor.

At this time, the electrons charged in the gate formed of, for example, polysilicon in some cases pass through the gate oxide film so as to reach the n+ region, which is the source and drain region. The passing of these electrons through the gate oxide film is equivalent to a phenomenon where a current flows from the n+ region toward the gate. Accordingly, a leak current is generated even in the case where the VDD is inputted into the source and drain (control terminal) of the transistor N42 that forms the capacitor C5' in the holding mode.

Figure 8:
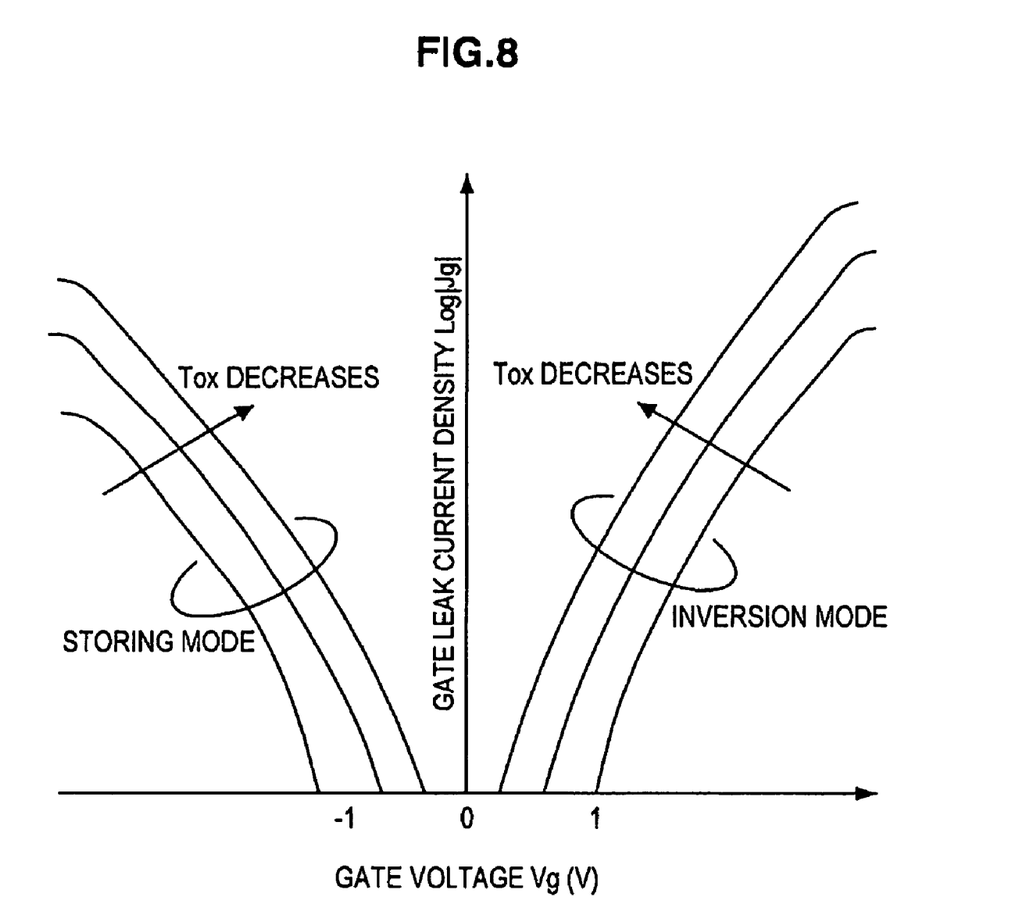
FIG. 8 is a diagram illustrating the relationship between the gate leak current and the thickness of the gate oxide film.

This leak current leads to attenuation of the signal component in the charge domain filter, making the filter performance decrease, and thus, relates to an important issue. Furthermore, the leak current increases as the CMOS process makes further miniaturization possible, as shown in FIG. 8. Here, in FIG. 8, Tox indicates the thickness of the gate oxide film, and generally, Tox decreases as the process makes further miniaturization possible.

FIG. 8 is a graph illustrating the relationship between the gate leak current and the thickness of the gate oxide film. Here, the longitudinal axis is for logarithm plotting. As shown in FIG. 8, the leak current in the gate greatly depends on the gate voltage Vg (difference in potential between the gate and the source/drain). Concretely, the leak current increases approximately exponentially as the gate voltage Vg increases.

In addition, it can be seen from FIG. 8 that the leak current in the gate increases as the thickness of the gate oxide film decreases for the same gate voltage Vg. Accordingly, it can be assumed that the thickness of the gate oxide film decreases as the CMOS process makes further miniaturization possible and the leak current increases, and therefore, the importance of the issue relating to such a leak current further increases.

Thus, in view of the above described state, the creation of the filter apparatus 100 according to the present embodiment is achieved. In the filter apparatus 100 according to the present embodiment, the leak current in the transistor that forms a capacitor C can be reduced. In the following, this filter apparatus 100 is described in detail in view of the amplifying portion 162 in this filter apparatus 100.

[3] Amplifying Portion that Forms Filter Apparatus

[3-1] First Example of Configuration of Amplifying Portion

Figure 9:
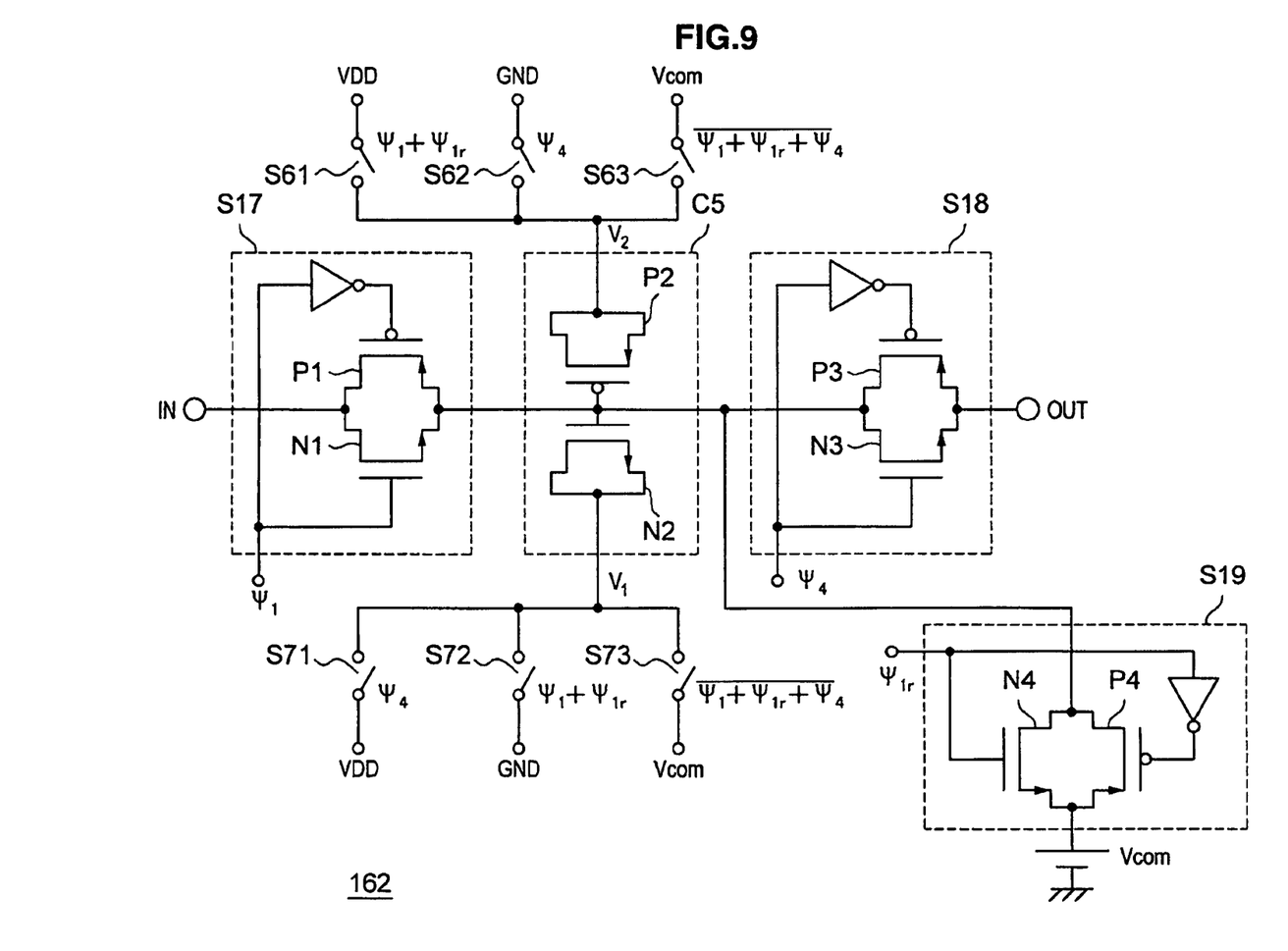
FIG. 9 is a diagram showing the configuration of an amplifying portion included in the charge domain filter circuit according to the present embodiment in detail.

FIG. 9 is a diagram illustrating the configuration of the amplifying portion 162 which is included in the charge domain filter circuit 110 according to the present embodiment in detail. The amplifying portion 162 includes a switch S17, which includes transistors P1 and N1, C5, which includes transistors P2 and N2, a switch S18, which includes transistors P3 and N3, and a switch S19, which includes transistors P4 and N4. Here, the alphabets included in the symbols of the transistors indicate the polarity of the transistors. Concretely, P indicates a P type MOS transistor and N indicates an N type MOS transistor.

The inverted signal of the control signal $\Psi 1$ is inputted into the gate of the transistor P1, and the control signal $\Psi 1$ is inputted into the gate of the transistor N1. Accordingly, the switch S17 is turned on while the control signal $\Psi 1$ is at the H level. When the switch S17 is turned on, an input signal is inputted into the capacitor C5 and the input signal is sampled by the capacitor C5 (circuit mode=sampling mode). Concretely, the input signal is inputted into the gate of the transistor N2 which functions as the input terminal and the gate of the transistor P2 which functions as the input terminal.

In addition, the inverted signal of the control signal $\Psi 4$ is inputted into the gate of the transistor P3, and the control signal $\Psi 4$ is inputted into the gate of the transistor N3. Accordingly, the switch S18 is turned on while the control signal $\Psi 4$ is at the H level. When the switch S18 is turned on, the capacitor C5 and the capacitor in the rear stage are electrically connected so that the charge stored in the capacitor C5 is outputted to the capacitor in the rear stage (circuit mode=output mode).

In the same manner, the inverted signal of the control signal $\Psi 1r$ is inputted into the gate of the transistor P4, and the control signal $\Psi 1r$ is inputted into the gate of the transistor N4. Accordingly, the switch S19 is turned on while the control signal $\Psi 1r$ is at the H level. When the switch S19 is turned on, the capacitor C5 and the common mode voltage Vcom, which is the reference voltage, are electrically connected so that the charge or voltage stored in the capacitor C5 is reset (circuit mode=reset mode). Here, the common mode voltage Vcom may have a voltage value which is ½ of the power supply voltage VDD so that the dynamic range of the filter apparatus 100 becomes maximum.

A three-valued voltage V1 having the power supply voltage VDD (first control signal), the ground voltage GND and the common mode voltage (second control signal) in accordance with the operation of the switches S71 to S73 is inputted into the control terminal (source and drain) of the transistor N2. The switch S71 is turned on during the period of time when the control signal $\Psi 4$, which switches the circuit mode to the output mode, is at the H level so that the power supply voltage VDD is inputted into the control terminal of the transistor N2 as the three-valued voltage V1.

In addition, the switch S72 is turned on during the period of time when the control signal $\Psi 1$, which switches the circuit mode to the sampling mode, and the control signal $\Psi 1r$, which switches the circuit mode to the reset mode, are at the H level. As a result, the ground voltage GND is inputted into the control terminal of the transistor N2 as the three-valued voltage V1 during the period of time when the control signal $\Psi 1$ and the control signal $\Psi 1r$ are at the H level.

In addition, the switch S73 is turned on during the period of time in which the circuit mode, for example, after the completion of the sampling mode and before being switched to the output mode, is a holding mode so that the common mode voltage Vcom is inputted into the control terminal of the transistor N2 as the three-valued voltage V1. Concretely, the switch S73 may be turned on during the period of time when the control signals $\Psi 1$, $\Psi 1r$ and $\Psi 4$ are at the H level. Here, though the control terminal of the transistor N2 is the GND at the time of $\phi 1r$ in the operation, it may be the VDD and may not be limited to these.

The relationship between the three-valued voltage V1 and the respective control signals $\Psi$ is described below with reference to FIG. 10 so that it can be visually understood.

Figure 10:
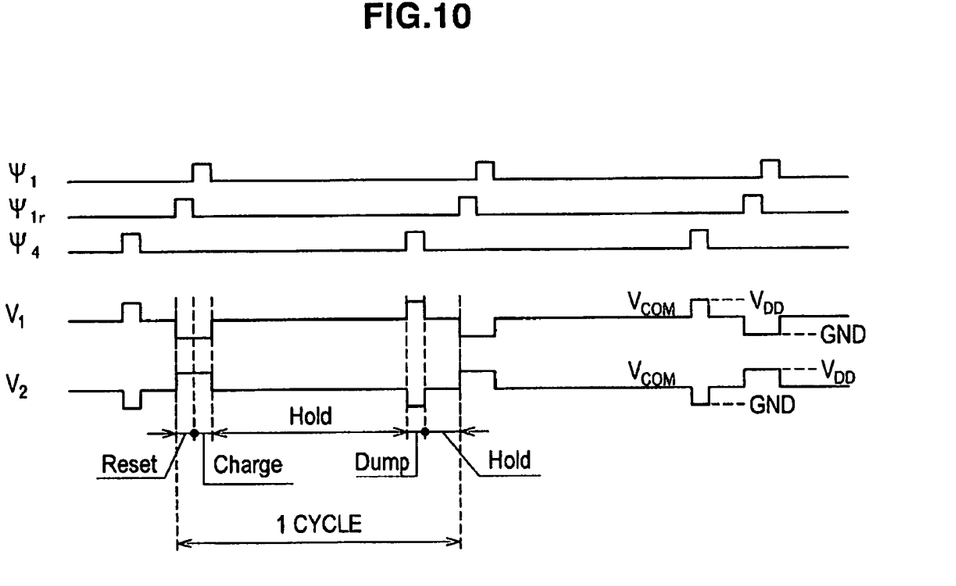
FIG. 10 is a diagram illustrating the relationship between a three-valued voltage V1 and the respective control signals Ψ.

FIG. 10 is a diagram illustrating the relationship between the three-valued voltage V1 and the respective control signals $\Psi$. As shown in FIG. 10, the three-valued voltage V1 becomes the ground voltage GND in the sampling mode where the control signal $\Psi 1$ is at the H level (charge) and in the reset mode where $\Psi 1r$ is at the H level (reset). In addition, the three-valued voltage V1 becomes the power supply voltage VDD in the output mode where the control signal $\Psi 4$ is at the H level (dump).

Meanwhile, the three-valued voltage V1 becomes the common mode voltage Vcom during a period of time which includes the time in the holding mode where the control signals $\Psi 1$, $\Psi 1r$ and $\Psi 4$ are at the L level (hold). Here, it is assumed that the voltage of the gate of the transistor N2 fluctuates with the common mode voltage Vcom at the center. Accordingly, in the holding mode, the difference in potential between the gate and the source/drain of the transistor N2 is reduced. As a result, the leak current which is generated in the gate of the transistor N2 during the period of time when the circuit mode is the holding mode can be kept low.

Here, though a leak current is generated in the gate of the P type MOS transistor in the same manner as in the N type MOS transistor, it is assumed that the amount of the leak current has a value which is one digit lower in comparison with that in the N type MOS transistor. Accordingly, though the leak current in the N type MOS transistor relates to an important issue, a three-valued voltage V2, which is the inverted signal of the three-valued voltage V1, may be inputted into, for example, the transistor P2 in order to keep the leak current in the P type MOS transistor low.

Concretely, a three-valued voltage V2 having the power supply voltage VDD, the ground voltage GND (first control signal) and the common mode voltage (second control signal) in accordance with the operation of the switches S61 to S63 is inputted into the control terminal (source and drain) of the transistor P2. The switch S61 is turned on during the period of time when the control signal $\Psi 1$, which switches the circuit mode to the sampling mode, and the control signal $\Psi 1r$, which switches the circuit mode to the reset mode, are at the H level so that the power supply voltage VDD is inputted into the control terminal of the transistor P2 as the three-valued voltage V2.

In addition, the switch S62 is turned on during the period of time where the control signal $\Psi 4$, which switches the circuit mode to the output mode, is at the H level so that the ground voltage GND is inputted into the control terminal of the transistor P2 as the three-valued voltage V2.

In addition, the switch S63 is turned on, for example, during the period of time where the circuit mode is the holding mode after the completion of the sampling mode and before being switched to the output mode. As a result, the common mode voltage Vcom is inputted into the control terminal of the transistor P2 as the three-valued voltage V2 during the period of time where the circuit mode is the holding mode. Concretely, the switch S63 may be turned on during the period of time in which the control signals Ψ1, Ψ1r and Ψ4 are at the L level. Here, though in the operation the control terminal of the transistor P2 has the VDD at the time of ϕ1r, it may have the GND and is not limited to these.

This three-valued voltage V2 is the inverted signal of the three-valued voltage V1 as shown in FIG. 10. That is to say, the three-valued voltage V2 becomes the power supply voltage VDD in the sampling mode where the control signal Ψ1 is at the H level (charge) and in the reset mode where Ψ1r is at the H level (reset). In addition, the three-valued voltage V1 becomes the ground voltage GND in the output mode where the control signal Ψ4 is at the H level (dump).

Meanwhile, the three-valued voltage V1 becomes the common mode voltage Vcom during the period of time which includes the time in the holding mode where the control signals Ψ1, Ψ1r and Ψ4 are at the L level (hold). Here, it is assumed that the voltage of the gate of the transistor P2 fluctuates with the common mode voltage Vcom at the center. Accordingly, in the holding mode, the difference in potential between the gate and the source/drain of the transistor P2 is reduced. As a result, the leak current which is generated in the gate of the transistor P2 during the period of time where the circuit mode is the holding mode can be kept low in the same manner as in the transistor N2.

Here, as shown in FIG. 9, the capacitor C5 is formed of a CMOS capacitor where the gates of the transistor N2 and the transistor P2 are connected to each other, and thus, the signal component where the direct current component is excluded from the input signal can be selectively amplified in the output mode. This is the same as in the second configuration and the third configuration, which are described below.

In addition, it seems that a leak current is generated in the switches S17 to S19 other than the capacitor C5, which are included in the amplifying portion 162. Here, the leak current is proportional to the area of the gate of the respective transistors. Therefore, the area of the gate of the respective transistors that form S17 to S19 is made smaller than that of the transistor that forms the capacitor C5, and thus, it becomes possible to reduce the ratio of the amount of the leak current in the switches S17 to S19 occupied in the total amount of the leak currents.

Here, in the case of the present embodiment, when the switches S17 to S19 are off, a voltage which is negative in comparison with the gate is applied to the source and drain of the transistors that form the switches S17 to S19. Accordingly, the amount of leak of the charge stored in C5 due to the OFF current (sub-threshold current) which flows from the source to the drain of the switches S17 to S19 is considered to be extremely small, and thus, it can be assumed that there are fewer effects than the leak current via the gate.

[3-2] Second Example of Configuration of Amplifying Portion

Next, the second example of the configuration of the amplifying portion 162 included in the charge domain filter circuit 110 according to the present embodiment is described with reference to FIG. 11.

Figure 11:
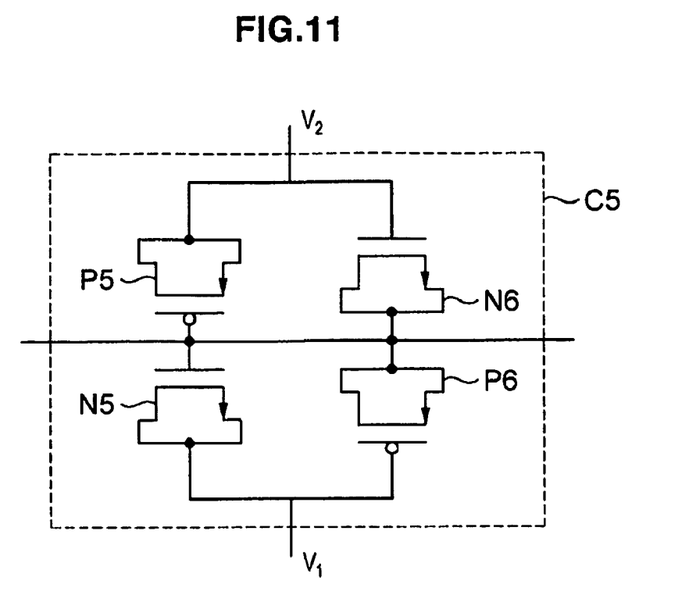
FIG. 11 is a diagram illustrating the configuration of a capacitor C which is included in the amplifying portion in the second example of the configuration.

FIG. 11 is a diagram illustrating the configuration of the capacitor C5 included in the amplifying portion 162 in the second example of the configuration. S17 to S19 can be formed to be essentially the same as the amplifying portion 162 in the first example of the configuration, and therefore, the descriptions thereof are omitted.

As shown in FIG. 11, the capacitor C5 included in the amplifying portion 162 in the second example of the configuration is provided with a transistor P5, a transistor N5, a transistor P6 and a transistor N6. The gate of the transistor P5, the gate of the transistor N5, the source/drain of the transistor P6 and the source/drain of the transistor N6 are connected to each other.

In addition, the same voltage as the three-valued voltage V1 described in the first example of the configuration is inputted into the source/drain of the transistor N5 and the gate of the transistor P6. Meanwhile, the same voltage as the three-valued voltage V2 described in the first example of the configuration is inputted into the source/drain of the transistor P5 and the gate of the transistor N6.

In the respective transistors, the difference in potential between the gate and the source/drain can be kept low in the holding mode in the same manner as in the first example of the configuration, and therefore, the leak current in the gate can be kept low.

[3-3] Third Example of Configuration of Amplifying Portion

Next, the third example of the configuration of the amplifying portion included in the charge domain filter circuit 110 according to the present embodiment is described with reference to FIG. 12.

Figure 12:
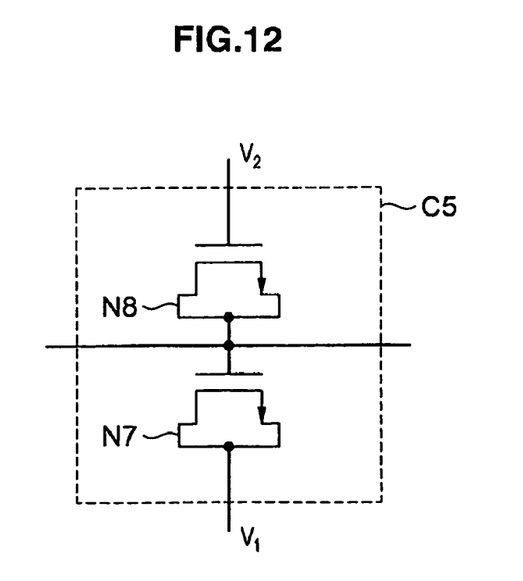
FIG. 12 is a diagram illustrating the configuration of a capacitor C which is included in the amplifying portion in the third example of the configuration.

FIG. 12 is a diagram showing the configuration of the capacitor C5 included in the amplifying portion 162 in the third example of the configuration. S17 to S19 can be formed so as to be essentially the same as the amplifying portion 162 according to the first example of the configuration, and therefore, descriptions thereof are omitted.

As shown in FIG. 12, the capacitor C5 included in the amplifying portion 162 in the third example of the configuration is provided with a transistor N7 and a transistor N8. The gate of the transistor P7 which is an input terminal and the source/drain of the transistor N8 which is an input terminal are connected to each other.

In addition, the same voltage as the three-valued voltage V1 described in the first example of the configuration is inputted into the source/drain of the transistor N7, which is a control terminal. Meanwhile, the same voltage as the three-valued voltage V2 described in the first example of the configuration is inputted into the gate of the transistor N8, which is a control terminal.

The difference in potential between the gate and the source/drain of the respective transistors is kept low in the holding mode, as in the first example of the configuration, and therefore, the leak current in the gate can be kept low.

Here, though FIG. 12 illustrates a case where the capacitor C5, which is a variable capacitor, is formed of two N type MOS transistors (N type MOS capacitors), the capacitor C5 may be formed of two P type MOS transistors (P type MOS capacitors). Concretely, the three-valued voltage V1 may be inputted into the gate of a first P type MOS transistor, the gate of the other P type MOS transistor may be connected to the source/drain of the first P type MOS transistor, and the three-valued voltage V2 may be inputted into the source/drain of the second P type MOS transistor.

Here, it is also possible to refer to the gate and the source/drain of the N type MOS transistors and the P type MOS transistors as first terminal and second terminal.

[4] Filtering Method Used in Filter Apparatus

The configuration of the filter apparatus 100 according to the present embodiment is described above. Next, the flow in the filtering method used in this filter apparatus 100 is described with reference to FIG. 13.

Figure 13:
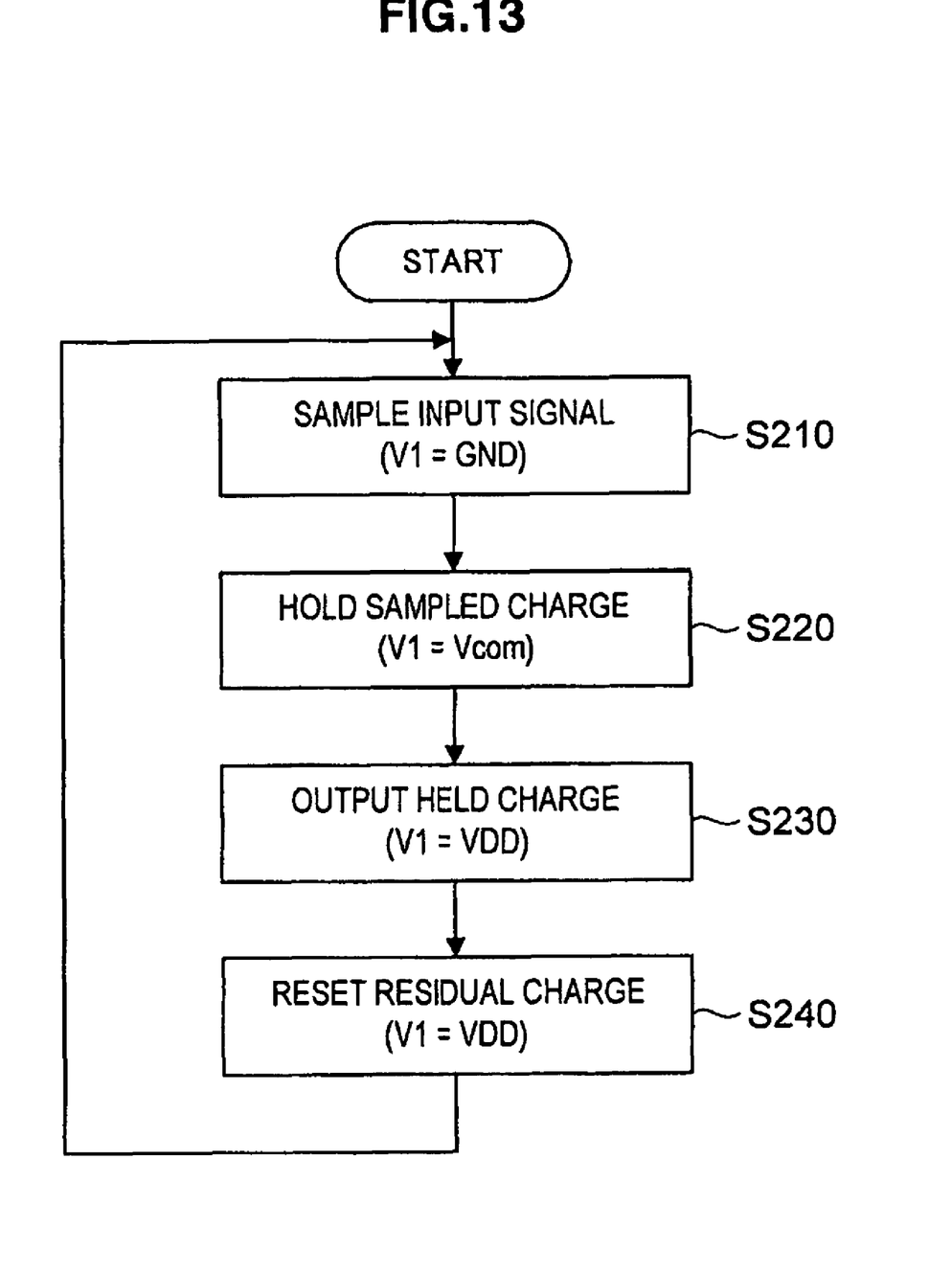
FIG. 13 is a flow chart showing the flow in the filtering method used in the filter apparatus according to the present embodiment.

FIG. 13 is a flow chart showing the flow in the filtering method used in the filter apparatus 100 according to the present embodiment. First, in a certain capacitor C included in the filter apparatus 100, the circuit mode is switched to the sampling mode and the input signal is sampled (S210). At this time, the ground voltage GND is inputted into the source/drain of the N type MOS transistor as the three-valued voltage V1 in the case where the capacitor C is formed of a CMOS capacitor as the capacitor C5 shown in FIG. 9.

Next, the circuit mode is switched to the holding mode in the capacitor C, which holds the charge gained through sampling (S220). At this time, the common mode voltage Vcom is inputted into the source/drain of the N type MOS transistor as the three-valued voltage V1 so that the leak current in the gate is kept low in the case where the capacitor C is formed of a CMOS capacitor as the capacitor C5 shown in FIG. 9.

After that, the circuit mode is switched to the output mode in the capacitor C, and the charge that is held is outputted to the capacitor C in the rear stage (S230). At this time, the power supply voltage VDD is inputted into the source/drain of the N type MOS transistor as the three-valued voltage V1 so that the capacitance is lowered in the case where the capacitor C5 is formed of a CMOS capacitor as the capacitor C5 shown in FIG. 9.

Next, the circuit mode is switched to the reset mode in the capacitor C so that the charge remaining in the capacitor C or the voltage is reset to the common mode voltage (S240). At this time, the power supply voltage VDD may be inputted into the source/drain of the N type MOS transistor as the three-valued voltage V1 in the case where the capacitor C is formed of a CMOS capacitor as the capacitor C5 shown in FIG. 9. Then, the procedure returns to the process in S240, so that the processes in S210 to S240 are repeated.

[5] Conclusions

As described above, the capacitor C samples the input signal in the sampling mode in the input terminal in the filter apparatus 100 according to the present embodiment, and holds the charge gained through sampling in the holding mode. In addition, the common mode voltage Vcom is inputted into the control terminal of the capacitor C, which is provided so as to face the input terminal with a gate oxide film in between in the holding mode.

Accordingly, in the holding mode, there is a difference in potential between the voltage which corresponds to the amount of charge gained through sampling and the common mode voltage Vcom in the control terminal, for example between the input terminal and the control terminal of the capacitor C. Here, it is assumed that the voltage value in the input terminal of the capacitor C fluctuates in the vicinity of the common mode voltage Vcom, and therefore, the difference in potential between the input terminal and the control terminal of the capacitor C is kept low. As a result, the amount of leak current in the gate of the capacitor C is reduced, so that attenuation or deterioration of the signal component in the input signal in the filter apparatus 100 can be kept low.

It should be understood by those skilled in the art that various modifications, combinations, sub-combinations and alterations may occur depending on design requirements and other factors insofar as they are within the scope of the appended claims or the equivalents thereof.

Though in the above described embodiment, for example, a case where the common mode voltage Vcom is inputted as the second control signal in the holding mode is described, the present invention is not limited to this example. For example, a voltage which is close to the common mode voltage Vcom may be inputted as the second control signal in the holding mode. In addition, the average voltage of the voltages in the input terminals of the capacitor C assumed in the holding mode may be inputted into the control terminal of the capacitor C as the second control signal.

In addition, a voltage sensing portion for sensing the voltage in the input terminal of the capacitor C may be provided, and the second control signal, of which the value of the voltage is dynamically set in accordance with the voltage sensed by the voltage sensing portion, may be inputted into the control terminal of the capacitor C.

In addition, though FIG. 10 shows a case where the common mode voltage Vcom is inputted into the control terminal of the capacitor C during the time when the circuit mode is switched from the output mode to the reset mode, a different value may be inputted for the voltage. In addition, the common mode voltage Vcom may be inputted into the control terminal of the capacitor C also in the reset mode.

In addition, it is not necessary to process the respective steps in the process of the filter apparatus 100 in the present specification chronologically in the order shown in the flow chart, and a process which is carried out in parallel or separately (for example, a parallel process or a process using objects) may be included.

What is claimed is:

1. A signal processing apparatus, comprising:
    a variable capacitor of which the capacitance is variable; and
    a switching portion for switching among a sampling mode for making an input signal sampled by the variable capacitor, a holding mode for holding a charge gained by sampling the input signal in the variable capacitor, an output mode for outputting a charge stored in the variable capacitor, and a reset mode, in which a common mode voltage is applied to an input terminal of the variable capacitor, wherein
    the variable capacitor includes
    the input terminal through which the input signal is inputted at the time of the sampling mode, and
    a control terminal to which a first control signal which decreases a capacitance of the variable capacitor to a value below a capacitance in the sampling mode is inputted in the output mode, and a second control signal having a predetermined reference voltage is inputted in the holding mode, where an insulating layer is provided between the control terminal and the input terminal, wherein the reference voltage is the same as the common mode voltage or a voltage close to the common mode voltage.

2. The signal processing apparatus according to claim 1, wherein the variable capacitor is a CMOS capacitor.

3. The signal processing apparatus according to claim 1, wherein
    the variable capacitor includes at least two N type MOS capacitors or at least two P type MOS capacitors,
    a first terminal of a first one of the N type MOS capacitors or the P type MOS capacitors is used as the input terminal and a second terminal of the first one of the N type MOS capacitors or the P type MOS capacitors is used as the control terminal, and
    a second terminal of a second one of the N type MOS capacitors or the P type MOS capacitors is used as the input terminal, and a first terminal of the second one of the N type MOS capacitors or the P type MOS capacitors is used as the control terminal.

4. A filter apparatus, wherein different variable capacitors sample input signals in sequence and at least a portion of a charge held in a number of the variable capacitors after sampling is outputted to a rear stage capacitor which can be electrically connected to the number of the variable capacitors, the filter apparatus comprising:
- a switching portion for switching among a sampling mode, in which the input signals are sampled by the variable capacitors, a holding mode in which a charge gained by sampling the input signals is held in the variable capacitors, and an output mode, in which a charge held by the variable capacitors is outputted, and
- the variable capacitors includes
- an input terminal through which the input signals are inputted in the sampling mode, and
- a control terminal to which a first control signal which decreases a capacitance of the variable capacitors to a value below a capacitance in the sampling mode is inputted in the output mode, and a second control signal having a predetermined reference voltage is inputted in the holding mode, where an insulating layer is provided between the control terminal and the input terminal.

5. A signal processing method, comprising the steps of:
inputting an input signal through an input terminal of a variable capacitor of which the capacitance is variable and making the variable capacitor sample the input signal;
holding a charge gained by sampling the input signal in the variable capacitor;
applying a common mode voltage or a voltage close to the common mode voltage to an input terminal of the variable capacitor; and
outputting the charge held in the variable capacitor, wherein
in the outputting step, a first control signal for lowering the capacitance of the variable capacitor to a value beneath a capacitance in the sampling step is inputted through a control terminal of the variable capacitor, the control terminal being arranged on a surface facing the input terminal of the variable capacitor via an insulating layer,
in the holding step, a second control signal having the common mode voltage or the voltage close to the common mode voltage is inputted through the control terminal of the variable capacitor.

6. A filtering method, comprising the steps of:
inputting input signals through input terminals of different variable capacitors in sequence and sampling the input signals in the variable capacitors;
holding a charge gained by sampling the input signals in the respective variable capacitors; and
outputting the charge held in two or more of the variable capacitors to a rear stage capacitor which is provided in a rear stage, wherein
in the output step, a first control signal which decreases a capacitance of the variable capacitors to a value below a capacitance in the sampling step is inputted through a control terminal of the variable capacitors, the control terminal being arranged on a side facing an input terminal via an insulating layer, and
in the holding step, a second control signal having a predetermined reference voltage is inputted through the control terminal of the variable capacitor.

* * * * *